(12) United States Patent
Ulrich et al.

(10) Patent No.: US 7,887,980 B2
(45) Date of Patent: Feb. 15, 2011

(54) SUB-RESOLUTIONAL GRAYSCALE RETICLE

(75) Inventors: Bruce D. Ulrich, Beaverton, OR (US); Yoshi Ono, Camas, WA (US); Wei Gao, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 235 days.

(21) Appl. No.: 12/193,568

(22) Filed: Aug. 18, 2008

(65) Prior Publication Data

US 2010/0040958 A1 Feb. 18, 2010

(51) Int. Cl.
*G03F 1/00* (2006.01)
*G03F 7/00* (2006.01)

(52) U.S. Cl. .......................................... 430/5; 430/311

(58) Field of Classification Search ................ 430/5, 430/311–313, 322
See application file for complete search history.

(56) References Cited

U.S. PATENT DOCUMENTS 5,821,013 A * 10/1998 Miller et al. .................. 430/5
6,046,466 A * 4/2000 Ishida et al. ................. 257/258
2008/0026299 A1 * 1/2008 Chai et al. .................... 430/5

\* cited by examiner

*Primary Examiner*—Stephen Rosasco
*Assistant Examiner*—Stewart A Fraser
(74) *Attorney, Agent, or Firm*—Law Office of Gerald Maliszewski; Gerald Maliszewski

(57) ABSTRACT

A sub-resolutional grayscale reticle and associated fabrication method have been presented. The method provides a transparent substrate, and forms a plurality of coincident partial-light transmissive layers overlying the transparent substrate. A pattern is formed, sub-resolutional at a first wavelength, in at least one of the transmissive layers. If there are n transmissive layers, the reticle transmits at least (n+1) intensities of light. In one aspect, each of the plurality of transmissive layers has the same extinction coefficient and the same thickness. In other aspects, the transmissive layers may have different thickness. Then, even if the extinction coefficients are the same, the attenuation of light through each layer is different. The transmission characteristics of the reticle can be further varied if the transmissive layers have different extinction coefficients. Likewise, the transmission characteristics through the sub-resolutional patterns can be varied.

18 Claims, 6 Drawing Sheets

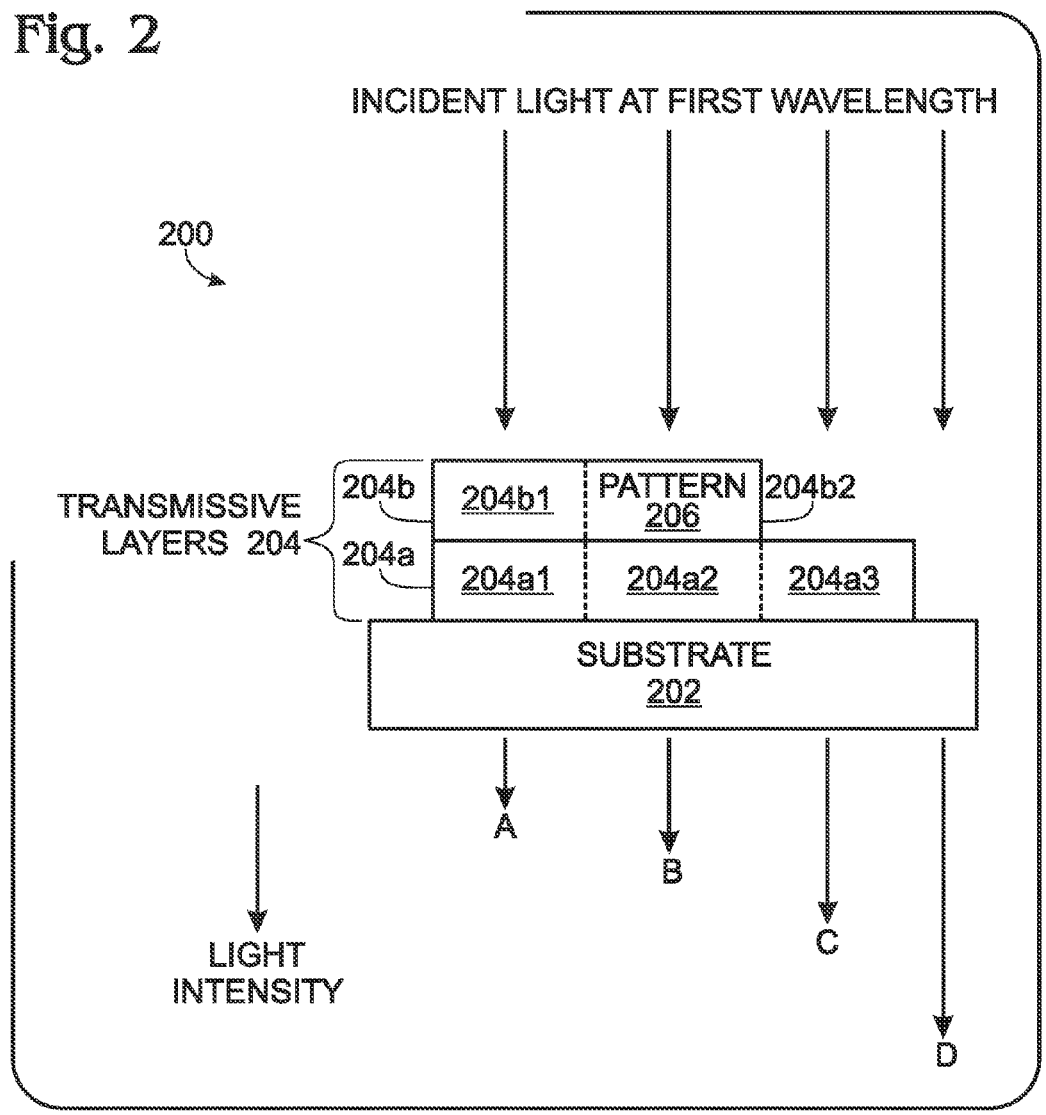
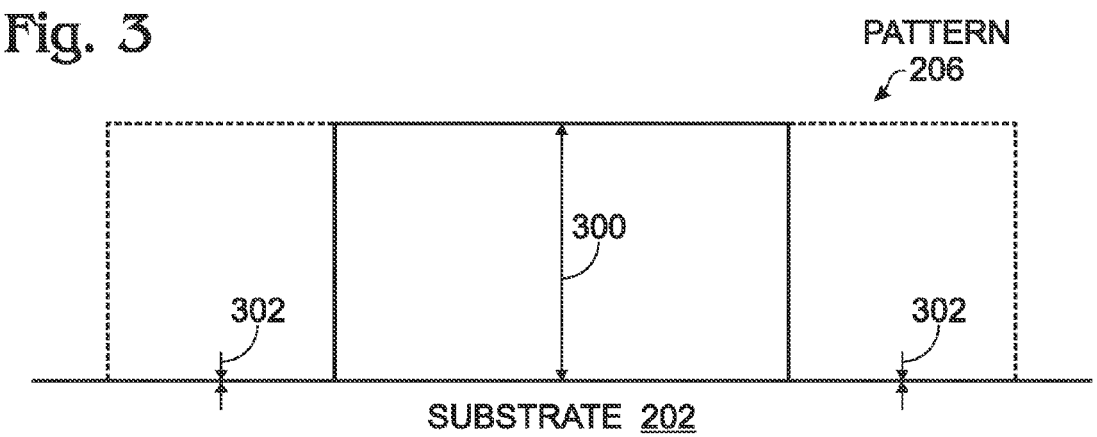

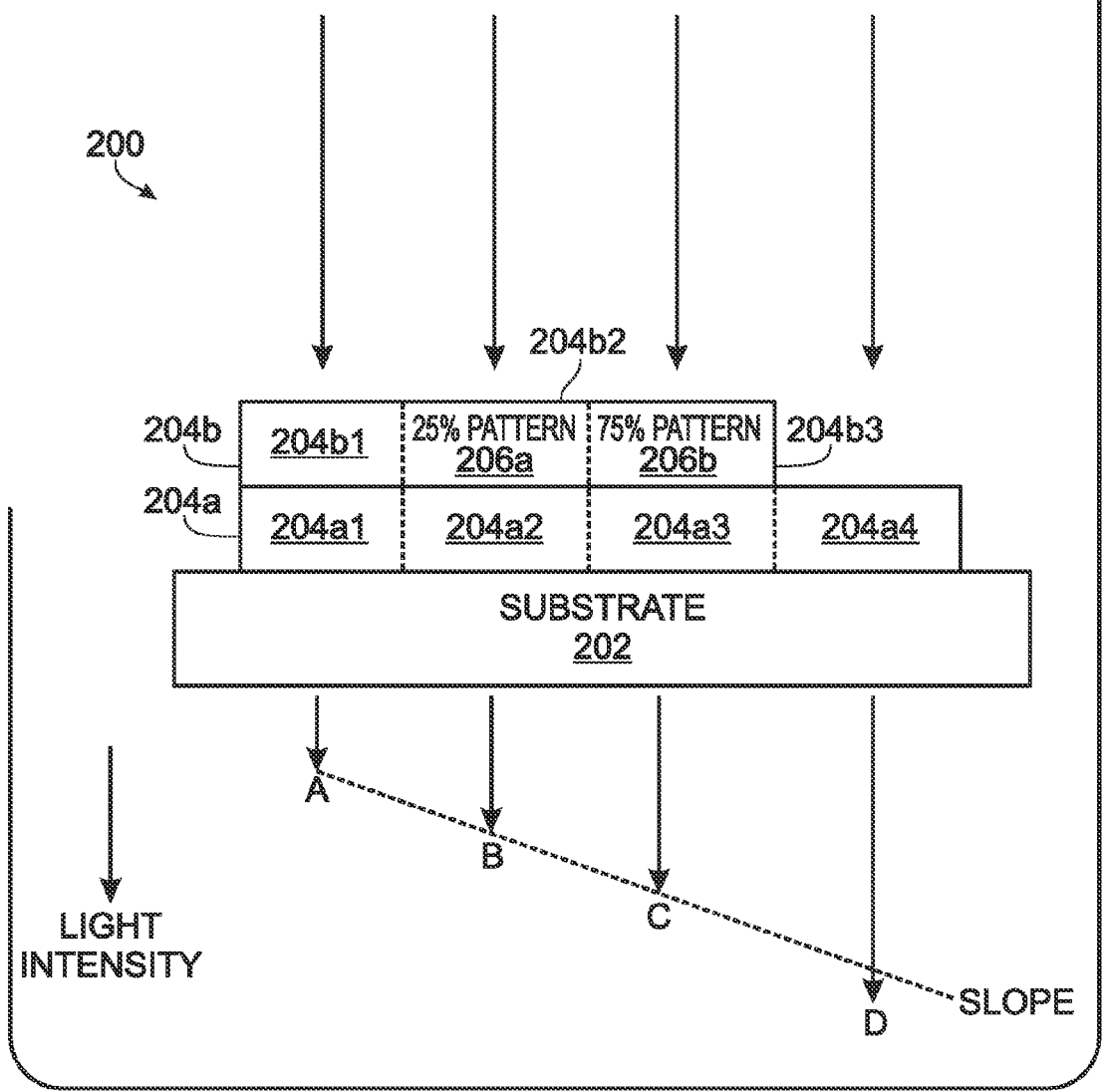
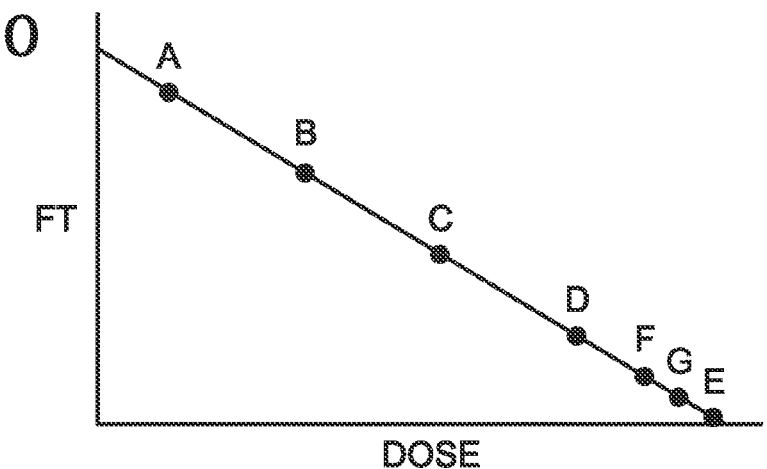

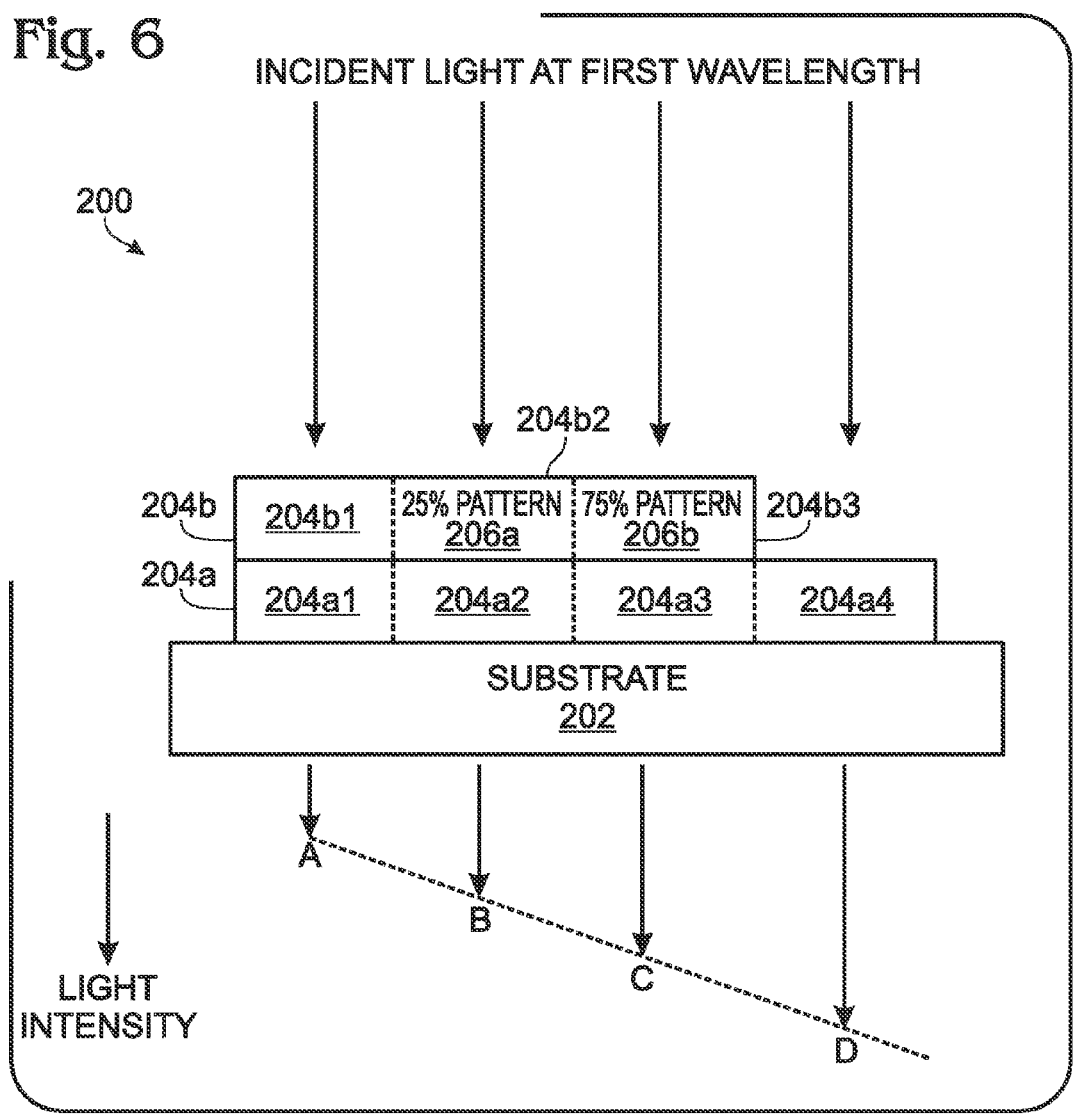
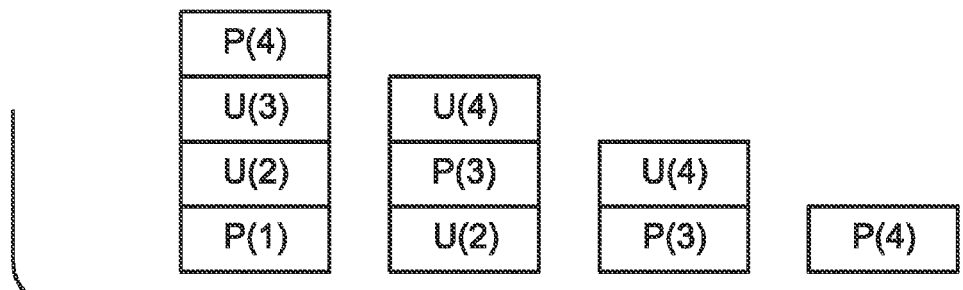

SUB-RESOLUTIONAL GRAYSCALE RETICLE

BACKGROUND OF THE INVENTION

1. Field of the Invention

This invention generally relates to integrated circuit fabrication and, more particularly, to an imaging reticle employing a combination of grayscale and sub-resolutional features.

2. Description of the Related Art

It has proven difficult to form a smooth slope in photoresist over a long distance, at a low angle. Conventional lithography, using a binary pattern of fully opaque and fully transparent regions, can only crudely do the job. This form of lithography produces a sloped transmission change in discrete steps (see FIG. 8). Light transmission is also modified by the diffractive nature of the light and its unresolved capture through the imaging system (diffraction limited regime). Sub-resolutional patterns are used in this regime. The main problem of producing a smooth sloped photoresist profile is the lateral dimension. If the lateral dimension is too large, greater than say 100 microns, then the change possible due to resolutional patterning is less than the full lateral dimension. This is due to a discrete increment in the patterning.

Grayscale technology has inherent characteristics that lend themselves to a gradual change in transmission from dark to light, which can be used to address the problem of producing a smooth slope of photoresist. Canyon Materials, Inc. is a company that makes grayscale reticles by use of an E-Beam tool and a High Energy e-Beam Sensitive (HEBS) film that changes the transmission of light with a corresponding dose of electrons from the E-Beam tool. The problem with this approach is that the cost of a reticle is high.

FIG. 1 is a diagram depicting a multilevel grayscale mask and a resulting photoresist pattern (prior art). Conventionally, a slope is formed in photoresist by layering grayscale material. The film thickness (FT) is proportional to the dose of light incident on the film. In this case the film is a positive acting photoresist, ("whatever shows goes"). Points A, B, C, D, and E are cardinal points representing unpatterned layers of Ti, in this case there are 4, 3, 2, 1, or no layers of Ti. Thus, dose A forms a photoresist (PR) thickness as a result of being attenuated by grayscale layers L(1), L(2), L(3), and L(4). Dose D forms a lesser PR thickness since light only passes through layer L(1) of the reticle. Although the layered approach is cheaper than using an E-beam tool, the multiple process steps required to fabricate such a reticle are complicated. Further, unless an impractical number of thin layers are used, the slope formed by such a reticle in the PR is not gradual, but rather, consists of relatively large discrete steps.

It would be advantageous if there was a cost-effective way of fabricating a grayscale reticle capable of forming gradual slopes in PR, at a low angle.

SUMMARY OF THE INVENTION

Presented herein is a grayscale type reticle that uses a twofold approach to making gradual changes in light transmission over long lateral dimensions. The reticle produces discrete changes in the transmission of incident light using corresponding changes in film thickness. The second aspect is to "fine tune" the transmission of light by a sub-resolutional pattern similar to conventional binary lithography, except that the pattern's film is not fully opaque. Multiple thicknesses of film span an overall range of transmittances in discrete steps, while sub-resolutional patterning may be used within each film layer to create finer levels of graduation between discrete steps. Essentially, a smooth slope is created as a combination of major steps and minor steps.

Accordingly, a method is provided for forming a sub-resolutional grayscale reticle. The method provides a transparent substrate, and forms a plurality of coincident partial-light transmissive layers overlying the transparent substrate. A pattern is formed, sub-resolutional at a first wavelength, in at least one of the transmissive layers. If there are n transmissive layers, the reticle transmits at least (n+1) intensities of light, in response to incident light at the first wavelength.

In one aspect, each of the plurality of transmissive layers has the same extinction coefficient and the same thickness. If the transmissive layers each have the same thickness, then the transmissive layers all have the same attenuation characteristics. In other aspects, the transmissive layers may have different thickness. Then, even if the extinction coefficients are the same, the attenuation of light through each layer is different. The transmission characteristics of the reticle can be further varied if the transmissive layers have different extinction coefficients.

Likewise, the transmission characteristics through the sub-resolutional patterns can be varied. Generally, each pattern is transmissive to incident light at the first wavelength, in response to the percentage of the transmissive layer thickness that is etched.

Additional details of the above-described method and a sub-resolution grayscale reticle are presented below.

BRIEF DESCRIPTION OF THE DRAWINGS

FIG. 2 is a partial cross-sectional view of a first exemplary sub-resolutional grayscale reticle and resultant transmitted light intensities.

FIG. 3 is a partial cross-sectional detailed view of the sub-resolutional pattern presented in FIG. 2.

FIG. 4 is a partial cross-sectional view depicting a second exemplary sub-resolutional grayscale reticle.

FIG. 6 is a partial cross-sectional view depicting a fourth exemplary sub-resolutional grayscale reticle.

FIG. 10 is a graph depicting PR film thickness (FT) as a function of dose (light transmitted through the reticle).

FIG. 12 is a schematic diagram alternative to the structure shown in FIG. 11.

DETAILED DESCRIPTION

Figure 7:
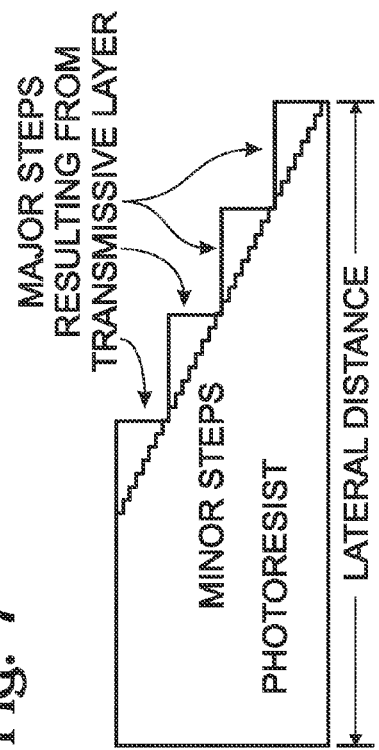
FIG. 7 is a diagram depicting a slope in a PR film composed of major and minor steps.

FIG. 2 is a partial cross-sectional view of a first exemplary sub-resolutional grayscale reticle and resultant transmitted light intensities. The reticle 200 comprises a transparent substrate 202, and a plurality of coincident partial-light transmissive layers 204 overlying the transparent substrate 202. Shown are layers 204a and 204b. However, the reticle is not limited to any particular number of layers. For example, the transmissive layer may be made from Ti or TiO$_2$. A pattern 206, sub-resolutional at a first wavelength (or greater), is formed in at least one of the transmissive layers. As shown, layer 204b includes pattern 206.

More explicitly, reticle 200 includes a transmissive layer 204a with first section 204a1 and second section 204a2, and a transmissive layer 204b having a first section 204b1 overlying the first section 204a1 of the transmissive layer 204, and a second section 204b2 overlying the second section 204a2 of the transmissive layer 204a. The pattern 206 is formed in the second section 204b2 of transmissive layer 204b. Transmissive layer 204 also includes an exposed third section 204a3, not overlain by transmissive layer 204b. Incident light at the first wavelength is transmitted with a first intensity (A) through the first sections 204a1 and 204b1 of the transmissive layers 204a and 204b, respectively. Incident light at a second intensity (B) greater than the first intensity is transmitted through the second sections 204a2 and 204b2 of transmissive layers 204a and 204b, respectively. Incident light at a third intensity (C), greater than the second intensity, is transmitted through the third section 204a3 of transmissive layer 204a. Note: the intensity of light through just the transparent substrate (D) is approximately equal in amplitude to the incident light.

Figure 1:
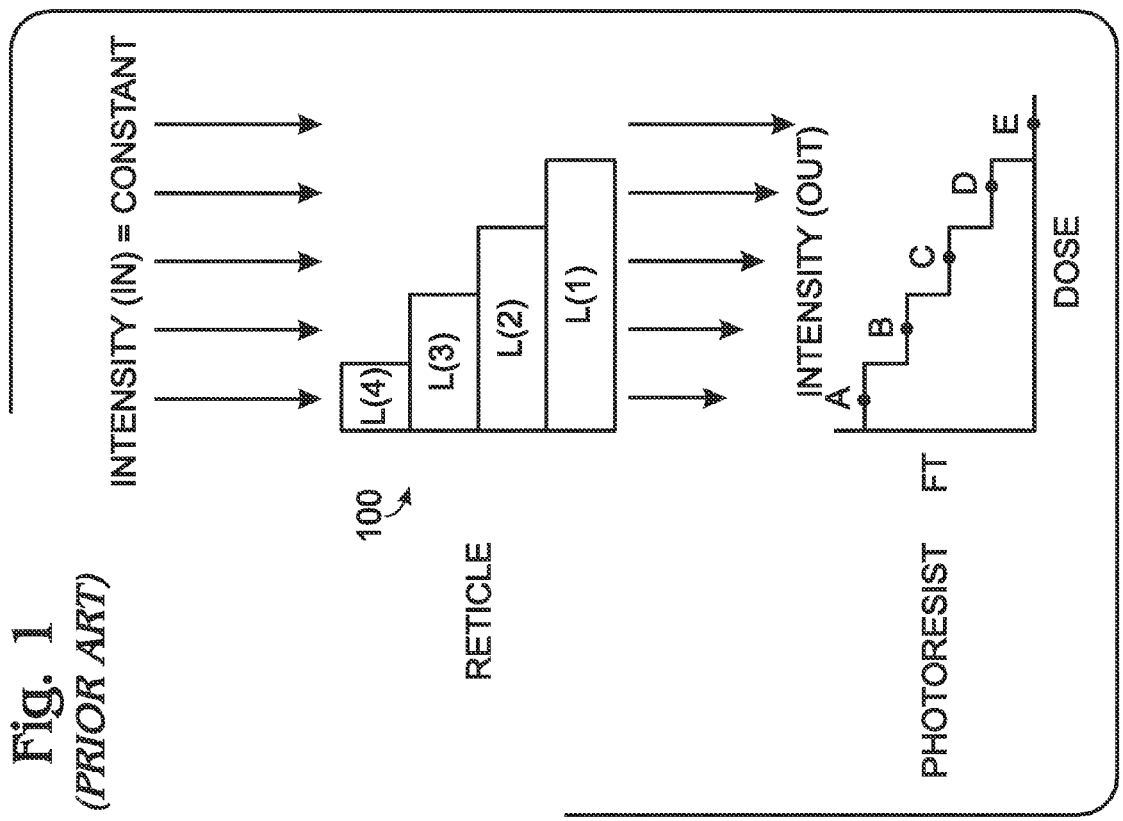
FIG. 1 is a diagram depicting a multilevel grayscale mask and a resulting photoresist pattern (prior art).

Generally, if the reticle 200 is made from n transmissive layers overlying the transparent substrate 202, then the reticle transmits at least (n+1) intensities light, in response to incident light at the first wavelength. Note: if a portion of the reticle is formed from just the transparent substrate, with no overlying transmissive layer, as with the reticle of FIG. 1 (dose E), then the reticle can be said to transmit at least (n+2) intensities of light. The reticle of FIG. 2 transmits 3 intensities of light, one intensity associated with each unpatterned transmissive layer, and one intensity associated with each pattern.

FIG. 3 is a partial cross-sectional detailed view of the sub-resolutional pattern 208 presented in FIG. 2. Generally, the pattern 206 is formed from at least two contrasting thicknesses of a transmissive layer. As shown, the pattern 206 is formed from a first thickness 300 of about 100% of a transmissive layer thickness, contrasted with a second thickness 302 of about a 0% of the transmissive layer thickness. Note: other patterns (not shown) may be made from two other contrasting thicknesses, such as 25% and 75%. In another aspect not shown, the pattern is formed by contrasting three or more transmissive layer thicknesses.

The pattern 206 is transmissive to incident light at the first wavelength, in response to the percentage of the transmissive layer first thickness included in the pattern. That is, the first thickness 300 may occupy between about 0 to 100% of the pattern. As shown, the first thickness occupies about 50% of the pattern. It should be remembered that the percentage of light blocked by the pattern is not necessarily directly proportional to the percentage of first thickness left in the pattern, since the transmissive layer, even at the first thickness, is not totally opaque. Further, since the pattern is sub-resolution, light transmitted through the pattern is partially transmitted to regions adjoining, but not underlying the pattern.

FIG. 4 is a partial cross-sectional view depicting a second exemplary sub-resolutional grayscale reticle. In this aspect, transmissive layer 204a includes first section 204a1, second section 204a2, third section 204a3, and an exposed fourth section 204a4. Transmissive layer 204b has a first section 204b1 overlying the first section 204a1 of transmissive layer, a second section 204b2 overlying the second section 204a2, and a third section 204b3 overlying the third section 204a3. A first pattern 206a is formed in the second section 204b2 of transmissive layer 204b, and a second pattern 206b is formed in the third section 204b3 of transmissive layer 204b.

As shown, the first pattern 206a is less transmissive to incident light at the first wavelength than the second pattern 206b. For example, the first pattern 206a transmits about 25% of incident light at the first wavelength, and the second pattern transmits about 75%. Thus, incident light at the first wavelength is transmitted with a first intensity (A) through the first sections 204a1 and 204b1 of transmissive layers 204a and 204b, respectively. Incident light is transmitted with a second intensity (B), greater than the first intensity, through the second sections 204a2 and 204b2 of transmissive layers 204a and 204b, respectively. Incident light with, a third intensity (C), greater than the second intensity, is transmitted through the third sections 204a3 and 204b3 of transmissive layers 204a and 204b, respectively. Incident light with a fourth intensity (D), greater than the third intensity, is transmitted through the fourth section 204a4 of transmissive layer 204a.

Figure 5:
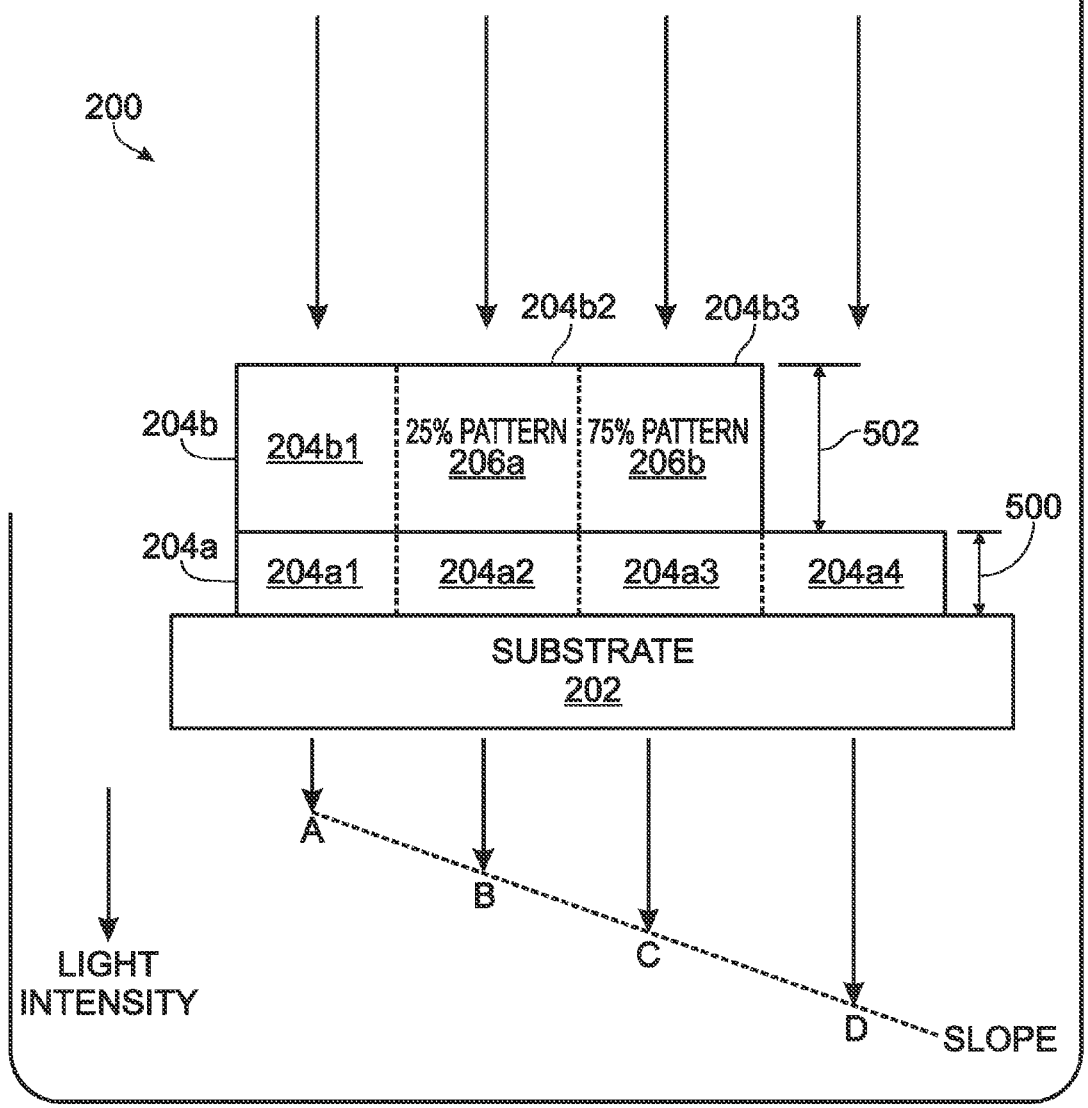
FIG. 5 is a partial cross-sectional view depicting a third exemplary sub-resolutional grayscale reticle.

FIG. 5 is a partial cross-sectional view depicting a third exemplary sub-resolutional grayscale reticle. In this aspect transmissive layer 204a has a first thickness 500 and transmissive layer 204b has a second thickness 502, different than the first thickness 500. As an additional variable, transmission (attenuation) through the reticle can be controlled by varying the thicknesses of the transmissive layers. Even if the extinction coefficients of the transmissive layers 204a and 204b are the same, the transmission characteristics (attenuation) of layers can be made different by using different thicknesses. For example, if transmissive layers 204a and 204b have the same extinction coefficient, light is attenuated more through layer 204b than through layer 204a, if layer 204b is thicker. Note: the use of two layers and two adjacent patterns in FIG. 4 does not necessarily create a perfectly linear change (slope) in transmitted light intensity (dose). However, the same pattern arrangement does produces a more linear change in FIG. 5, since the use of two patterns in transmissive layer 204b permits the larger discrete step (associated with the greater thickness) to be broken into two sub-steps. Even greater variations can be created through the reticle if the transmissive layers have different extinction coefficients.

FIG. 6 is a partial cross-sectional view depicting a fourth exemplary sub-resolutional grayscale reticle. In this aspect, transmissive layer 204a has a first extinction coefficient (k) or absorption rate, and transmissive layer 204b has a second extinction coefficient, different than the first extinction coefficient.

$$I=I_O e^{-kd}$$

where I is light transmitted through the reticle;

$I_O$ is light incident to the reticle; and, d is the thickness of a transmissive layer.

Even if the thicknesses of the transmissive layers 204a and 204b are the same, the transmission characteristics of layers (attenuation) can be made different by using different extinction coefficients. For example, if transmissive layers 204a and 204b have the same thickness, light is attenuated more through layer 204b than through layer 204a, if the extinction coefficient of layer 204b is greater than the extinction coefficient of layer 204a. Note: the use of two layers and two adjacent patterns in FIG. 4 does not necessarily create a perfectly linear change in transmitted light intensity. However, the same pattern arrangement does produce a more linear change in FIG. 8, since the use of two patterns in transmissive layer 204b permits the larger discrete step (associated with the greater extinction coefficient) to be broken into two sub-steps. Even greater variations can be created through the reticle if the transmissive layers have different thicknesses.

Functional Description

FIG. 7 is a diagram depicting a slope in a PR film composed of major and minor steps. A smooth slope in a PR film can be created through the use of major steps and minor steps. The major steps are associated with the different transmissive layers, and the minor steps are associated with the use the sub-resolutional patterns. Alternately stated, the major steps result as a function of reticle layer thickness and the minor steps result as a function of the sub-resolutional patterning.

Figure 8:
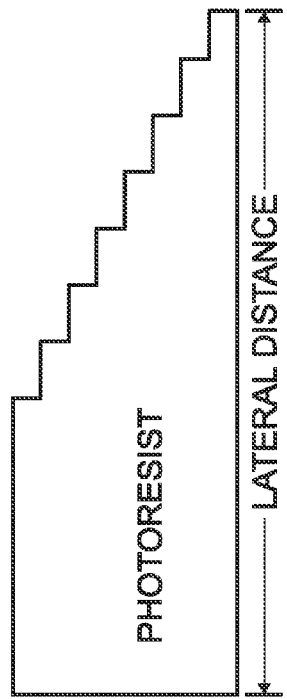
FIG. 8 depicts a photoresist film patterned using a conventional binary lithography process (prior art).

FIG. 8 depicts a photoresist film patterned using a conventional binary lithography process (prior art). Conventional reticles are usually made of a glass or quartz substrate with Cr or CrO, patterned and etched to yield a "binary" reticle that has two levels of transmission, either fully transparent or fully opaque. The gradual slope seen in FIG. 7 cannot be achieved using a single layer of opaque film and sub-resolutional patterns (unless the lateral dimension is very small). In fact, the sub-resolutional patterns used to make the PR film of FIG. 8 are of the same configuration as ones used to create the minor steps in FIG. 7. The difference is that the sub-resolutional grayscale reticle associated with the slope of FIG. 7 includes four times as many patterns, with the lateral extent of each sub-resolutional pattern being only a quarter of the lateral distance as that used to create the slope see in FIG. 8.

In contrast, the reticles of FIGS. 2-6 combine both binary and grayscale lithographies. A unique aspect of these reticles is that they can be used to produce smooth ramps of photoresist. For example, a pyramid with a smooth slope can be made. Another aspect of the invention is that the lateral length of the ramp can be made larger in the lateral dimension, with a higher degree of control, than one formed from a conventional binary reticle.

Since the patterns are sub-resolutional, images incident to the pattern are not resolved. The net effect is that the pattern works like a water valve in a pipe, where the amount of water passing through the pipe is a function of the value position. With respect to the reticle, the amount of light that gets though the optical system is a function of the pattern shape.

Figure 9:
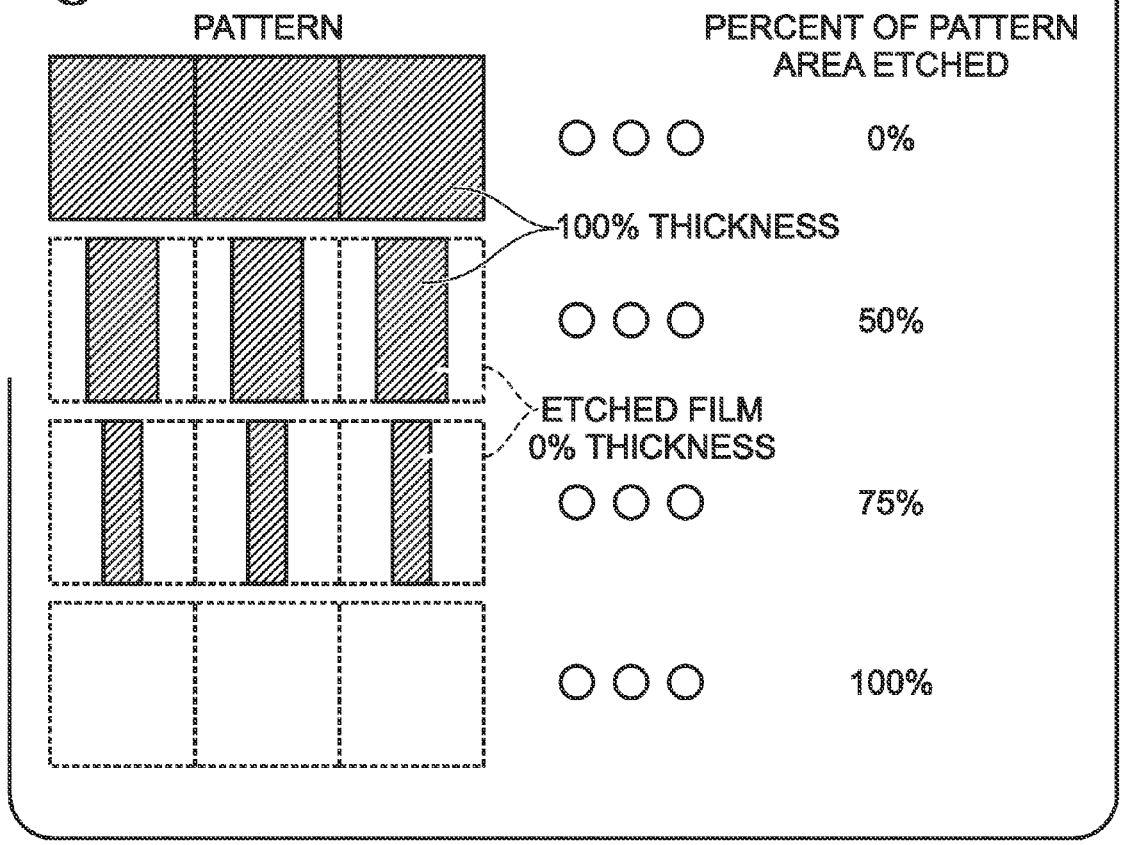
FIG. 9 is a plan view representing some exemplary patterns.

FIG. 9 is a plan view representing some exemplary patterns. Four patterns have been etched into a single transmissive layer where each pattern has a different transmission value. The left portion of the figure shows four patterns that consist of a single layer of Ti. The dashed areas only indicate a unit cell of repetition. The right portion of the figure indicates the amount of the unit cell that is patterned.

FIG. 10 is a graph depicting PR film thickness (FT) as a function of dose (light transmitted through the reticle). The difference in dose between points D and E is the result of a major step (a transmissive layer). For example, dose D passes through a first transmissive layer, while dose E passes through no transmissive layer. By using a 50% and a 75% patterns in the first transmissive layer, the resultant film thickness becomes sloped instead of stepped, yielding points F and G.

Figure 11:
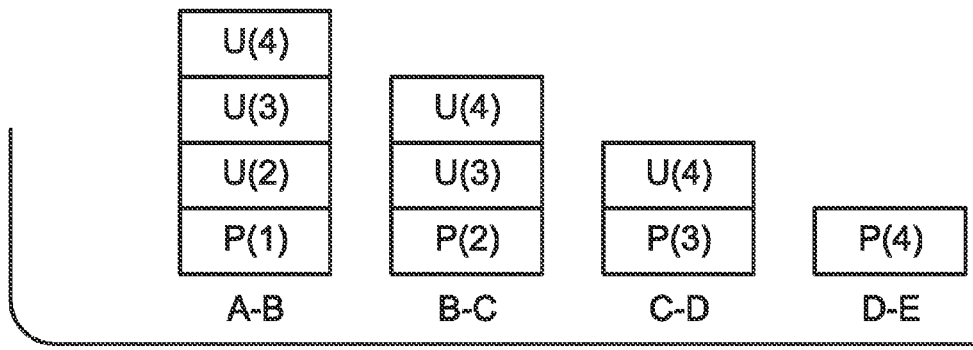
FIG. 11 is a schematic diagram showing how the intermediate points between the cardinal points (A, B, C, D, and E) of FIG. 10 can be realized.

FIG. 11 is a schematic diagram showing how the intermediate points between the cardinal points (A, B, C, D, and E) of FIG. 10 can be realized. Shown are film stacks of varying number of layers of Ti, where the bottom layer is the patterned and denoted with the letter P. The unpatterned layers are denoted by the letter U. The numbers in parentheses denote the layer number. Note: all the patterning is performed in the first (bottom) transmissive layer (1).

FIG. 12 is a schematic diagram alternative to the structure shown in FIG. 11. As an alternative, patterning may be performed in different transmissive layers. As shown, each layer includes a patterned section.

Figure 13:
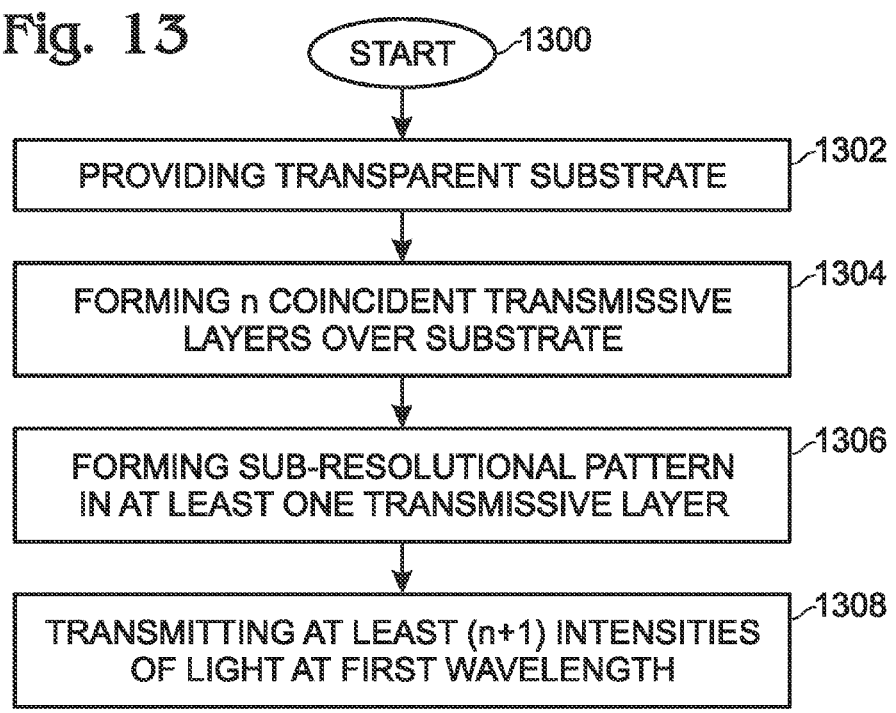
FIG. 13 is a flowchart illustrating a method for forming a sub-resolutional grayscale reticle.

FIG. 13 is a flowchart illustrating a method for forming a sub-resolutional grayscale reticle. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 provides a transparent substrate. Step 1304 forms a plurality of coincident partial-light transmissive layers overlying the transparent substrate. Step 1306 forms a pattern, sub-resolutional at a first wavelength, in at least one of the transmissive layers. If forming the plurality of transmissive layers in Step 1304 includes forming n transmissive layers, then in Step 1308 the reticle transmits at least (n+1) intensities of light, in response to incident light at the first wavelength.

In one aspect, forming the pattern in Step 1306 includes forming a pattern from at least two contrasting thicknesses of a transmissive layer. For example, the pattern may be formed from a first thickness of about 100% of a transmissive layer thickness, contrasted with a second thickness of about a 0% of the transmissive layer thickness. Further, the pattern formed in Step 1306 is transmissive to incident light at the first wavelength, in response to the percentage of the transmissive layer first thickness in the pattern. That is, pattern is formed from a first thickness that occupies between about 0 to 100% of the pattern.

In another aspect, forming the plurality of transmissive layers in Step 1302 includes forming a first transmissive layer with a first thickness and a second transmissive layer having a second thickness, different than the first thickness.

In a different aspect, Step 1302 forms a first transmissive layer with a first extinction coefficient and a second transmissive layer having a second extinction coefficient, different than the first extinction coefficient.

A sub-resolutional grayscale reticle and associated fabrication process have been provided. Examples of materials, pattern shapes, and light intensity doses have been presented to illustrate the invention. However, the invention is not limited to merely these examples. Other variations and embodiments of the invention will occur to those skilled in the art.

We claim:

1. A sub-resolutional grayscale reticle comprising:
    a transparent substrate;
    a plurality of coincident partial-light transmissive layers overlying the transparent substrate;
    a pattern, sub-resolutional at a first wavelength, formed in at least one of the transmissive layers; and,
    wherein the pattern is formed from at least a first thickness of the transmissive layer that is less than or equal to 100% of a transmissive layer thickness, and a second thickness of the transmissive layer, adjacent the first thickness, that is greater than 0% of the transmissive layer thickness, and where the first thickness is greater than the second thickness.

2. The reticle of claim 1 wherein n transmissive layers overlie the transparent substrate; and,
    wherein the reticle transmits at least (n+1) intensities of light, responsive to incident light at the first wavelength.

3. The reticle of claim 1 wherein the plurality of transmissive layers includes a first transmissive layer with first and second sections, and a second transmissive layer having a first section overlying the first section of the first transmissive layer, and a second section overlying the second section of the first transmissive layer; and, wherein the pattern is formed in the second section of the second transmissive layer.

4. The reticle of claim 3 wherein the first transmissive layer includes an exposed third section, not overlain by the second transmissive layer; and, wherein incident light at the first wavelength is transmitted with a first intensity through the first sections of the first and second transmissive layer, a second intensity greater than the first intensity through the second sections of the first and second transmissive layers, and a third intensity greater than the second intensity through the third section of the first transmissive layer.

5. The reticle of claim 1 wherein the pattern is transmissive to incident light at the first wavelength, in response to the percentage of the transmissive layer first thickness included in the pattern.

6. The reticle of claim 1 wherein the first thickness occupies greater than 0% of the pattern and less than 100% of the pattern.

7. The reticle of claim 1 wherein the plurality of transmissive layers includes:

a first transmissive layer with first, second, and third sections, and an exposed fourth section;

a second transmissive layer having a first section overlying the first section of the first transmissive layer, a second section overlying the second section of the first transmissive layer, and a third section overlying the third section of the first transmissive layer; and, wherein a first pattern is formed in the second section of the second transmissive layer, and a second pattern is formed in the third section of the second transmissive layer.

8. The reticle of claim 7 wherein the first pattern is less transmissive to incident light at the first wavelength than the second pattern; and, wherein incident light at the first wavelength is transmitted with a first intensity through the first sections of the first and second transmissive layers, a second intensity greater than the first intensity through the second sections of the first and second transmissive layers, a third intensity greater than the second intensity through the third sections of the first and second transmissive layers, and a fourth intensity greater than the third intensity through the fourth section of the first transmissive layer.

9. The reticle of claim 1 wherein the plurality of transmissive layers include a first transmissive layer with a first thickness and a second transmissive layer having a second thickness, different than the first thickness.

10. The reticle of claim 1 wherein the plurality of transmissive layers include a first transmissive layer with a first extinction coefficient and a second transmissive layer having a second extinction coefficient, different than the first extinction coefficient.

11. A method for forming a sub-resolutional grayscale reticle, the method comprising:

providing a transparent substrate;

forming a plurality of coincident partial-light transmissive layers overlying the transparent substrate; and, forming a pattern, sub-resolutional at a first wavelength, in at least one of the transmissive layers, where the pattern is formed from at least a first thickness of the transmissive layer that is less than or equal to 100% of a transmissive layer thickness, and a second thickness of the transmissive layer, adjacent the first thickness, that is greater than 0% of the transmissive layer thickness, and where the first thickness is greater than the second thickness.

12. The method of claim 11 wherein forming the plurality of transmissive layers includes forming n transmissive layers; and, the method further comprising:

transmitting at least (n+1) intensities of light from the reticle, in response to incident light at the first wavelength.

13. The method of claim 11 wherein forming the pattern includes forming a pattern transmissive to incident light at the first wavelength, in response to the percentage of the transmissive layer first thickness in the pattern.

14. The method of claim 11 wherein forming the pattern includes forming a pattern with a first thickness that occupies greater than 0% of the pattern and less than 100% of the pattern.

15. The method of claim 11 wherein forming the plurality of transmissive layers includes forming a first transmissive layer with a first thickness and a second transmissive layer having a second thickness, different than the first thickness.

16. The method of claim 11 wherein the forming the plurality of transmissive layers includes forming a first transmissive layer with a first extinction coefficient and a second transmissive layer having a second extinction coefficient, different than the first extinction coefficient.

17. A sub-resolutional grayscale reticle comprising:

a transparent substrate;

a plurality of coincident partial-light transmissive layers overlying the transparent substrate, including a first transmissive layer with a first extinction coefficient and a second transmissive layer with a second extinction coefficient, different than the first extinction coefficient; and, a pattern, sub-resolutional at a first wavelength, formed in at least one of the transmissive layers, where the pattern is formed from at least a first thickness of the transmissive layer that is less than or equal to 100% of a transmissive layer thickness, and a second thickness of the transmissive layer, adjacent the first thickness, that is greater than 0% of the transmissive layer thickness, and where the first thickness is greater than the second thickness.

18. A sub-resolutional grayscale reticle comprising:

a transparent substrate;

a plurality of coincident partial-light transmissive layers overlying the transparent substrate, including a first transmissive layer and a second transmissive layer overlying the first transmissive layer;

a first pattern, sub-resolutional at a first wavelength, formed in the first transmissive layer;

a second pattern, sub-resolutional at the first wavelength, formed in the second transmissive layer and overlying the first pattern; and, wherein at least one of the patterns is formed from at least a first thickness of the transmissive layer that is less than or equal to 100% of a transmissive layer thickness, and a second thickness of the transmissive layer, adjacent the first thickness, that is greater than 0% of the transmissive layer thickness, and where the first thickness is greater than the second thickness.

* * * * *